US012648405B2

(12) United States Patent (10) Patent No.: US 12,648,405 B2

Hiza et al. (45) Date of Patent: Jun. 2, 2026

(54) METHOD OF MANUFACTURING SEMICONDUCTOR SUBSTRATE AND METHOD OF MANUFACTURING SEMICONDUCTOR DEVICE

(71) Applicant: Mitsubishi Electric Corporation, Tokyo (JP)

(72) Inventors: Shuichi Hiza, Tokyo (JP); Kunihiko Nishimura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 405 days.

(21) Appl. No.: 18/265,434

(22) PCT Filed: Feb. 4, 2021

(86) PCT No.: PCT/JP2021/004035

§ 371 (c)(1),
(2) Date: Jun. 6, 2023

(87) PCT Pub. No.: WO2022/168217

PCT Pub. Date: Aug. 11, 2022

(65) Prior Publication Data

US 2024/0030055 A1 Jan. 25, 2024

(51) Int. Cl.
*H01L 21/683* (2006.01)
*H10P 14/20* (2026.01)
(Continued)

(52) U.S. Cl.
CPC ...... *H10P 72/7402* (2026.01); *H10P 14/3416* (2026.01); *H10D 30/015* (2025.01); *H10P 72/7434* (2026.01); *H10P 72/744* (2026.01)

(58) Field of Classification Search
CPC ............. H10P 72/7402; H10P 14/3416; H10P 72/7434; H10P 72/744; H10D 30/015
See application file for complete search history.

(56) References Cited

U.S. PATENT DOCUMENTS 6,420,242 B1 * 7/2002 Cheung ............... H01L 21/2007
257/E21.121
6,872,635 B2 * 3/2005 Hayashi ............. H01L 21/6835
438/464

(Continued)

FOREIGN PATENT DOCUMENTS

JP 6-268183 A 9/1994
JP 2019-026817 A 2/2019

OTHER PUBLICATIONS

Extended European Search Report issued Mar. 5, 2024, in corresponding European Patent Application No. 21924614.7, 8 pages.

(Continued)

*Primary Examiner* — Jay C Kim

(74) *Attorney, Agent, or Firm* — XSENSUS LLP

(57) ABSTRACT

A nitride semiconductor layer formed on a growth substrate is attached to a support substrate via a reversible adhesive layer. Next, the growth substrate is removed, a new substrate is bonded to the exposed nitride semiconductor layer, and subsequently, the reversible adhesive layer and the support substrate are removed. As a result, the nitride semiconductor layer is transferred on the new substrate from the growth substrate. Performed in a step of bonding the nitride semiconductor layer and the new substrate are a step of pressure-contacting the nitride semiconductor layer and the new substrate, a step of softening the reversible adhesive layer, and a step of curing the reversible adhesive layer again.

12 Claims, 9 Drawing Sheets

(51) Int. Cl.
  *H10P 72/70*        (2026.01)
  *H10D 30/01*        (2025.01)

(56)                    References Cited

U.S. PATENT DOCUMENTS

| | | | |
|---|---|---|---|
| 6,911,375 B2 * | 6/2005 | Guarini ............... | H01L 21/6835 |
| | | | 438/455 |
| 7,439,160 B2 * | 10/2008 | Le Vaillant ....... | H01L 21/76254 |
| | | | 438/459 |
| 9,972,521 B2 * | 5/2018 | Nakajima ........... | B32B 38/0012 |
| 12,087,726 B2 * | 9/2024 | Burggraf ........... | H01L 21/67121 |
| 2008/0122119 A1 * | 5/2008 | Kian ................... | H01L 21/6835 |
| | | | 438/118 |
| 2009/0087961 A1 * | 4/2009 | Hartmann ........... | H01L 21/2007 |
| | | | 438/763 |
| 2011/0014774 A1 | 1/2011 | Johnson et al. | |
| 2019/0214260 A1 * | 7/2019 | Francis ................ | H01L 21/187 |
| 2019/0362974 A1 | 11/2019 | Nakamura et al. | |

OTHER PUBLICATIONS

International Search Report and Written Opinion mailed on May 11, 2021, received for PCT Application PCT/JP2021/004035, filed on Feb. 4, 2021, 8 pages including English Translation.
Felix Ejeckam, "Keeping cool with diamond" Compound Semiconductor, vol. 20, Issue 7, 2014, pp. 41-46.
Francis et al., "Formation and characterization of 4-inch GaN-on-diamond substrates", Diamond & Related Materials, vol. 19 (2010), pp. 229-233.
Kuzuhara et al., "AlGaN/GaN Heterojunction FETs for High Power Applications", IEICE Transactions on Electronics (Japanese Edition), vol. J86-C, No. 4, Apr. 2003, pp. 396-403 (16 pages including English Translation).

* cited by examiner

F I G. 1
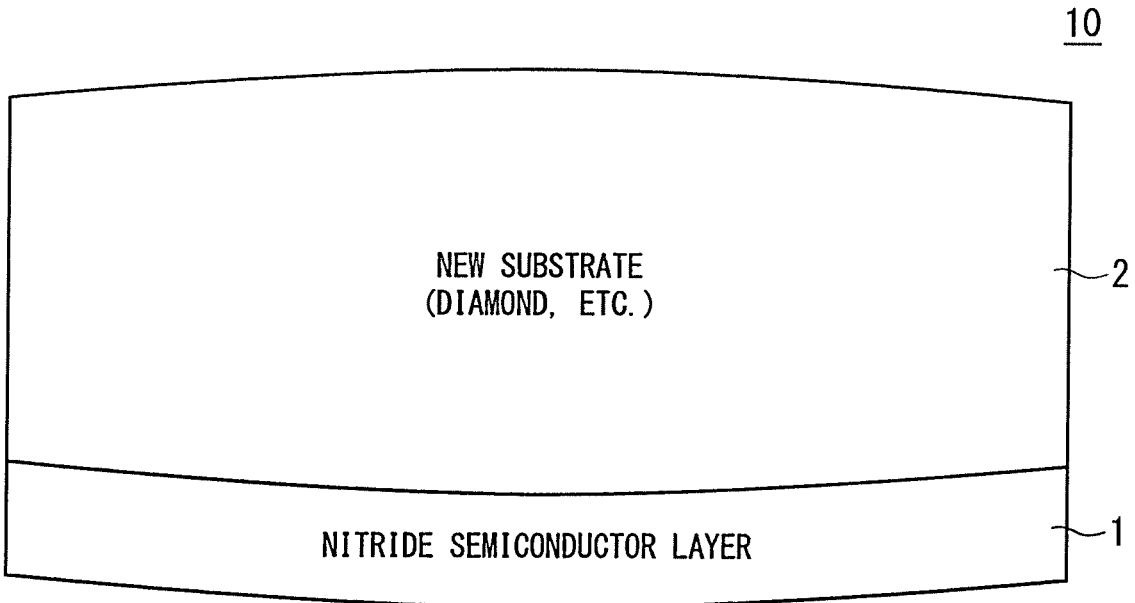

F I G. 2
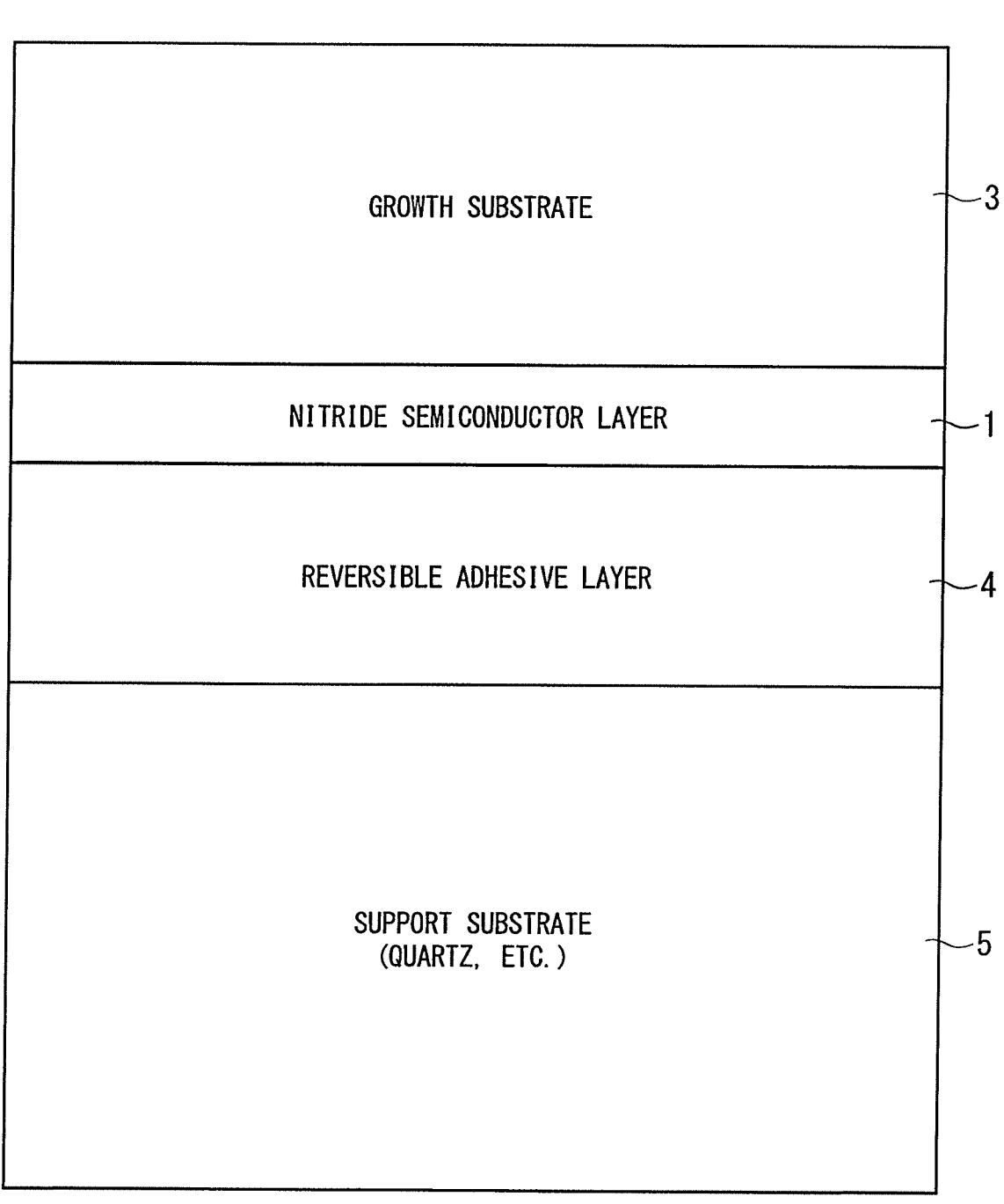

F I G.  3
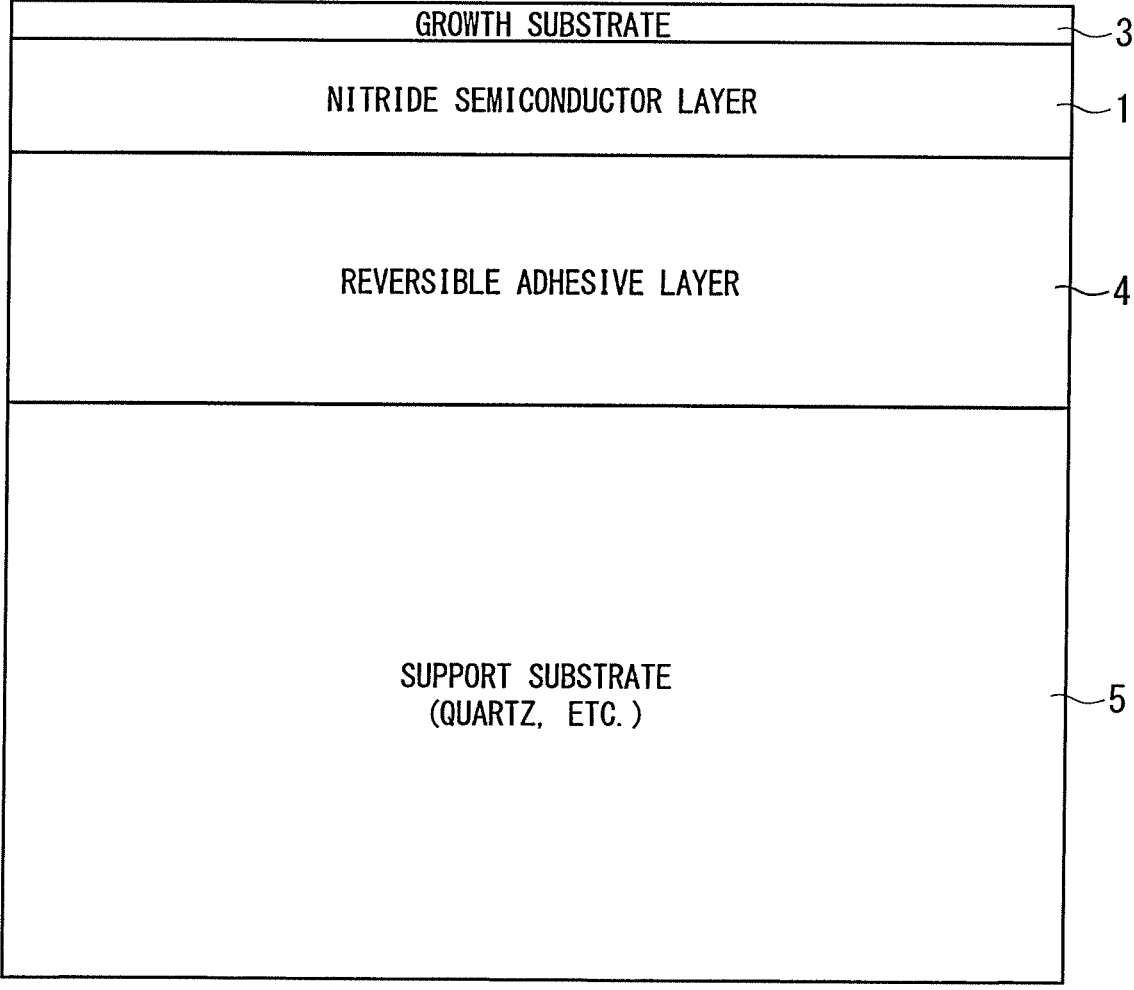

F I G.  4
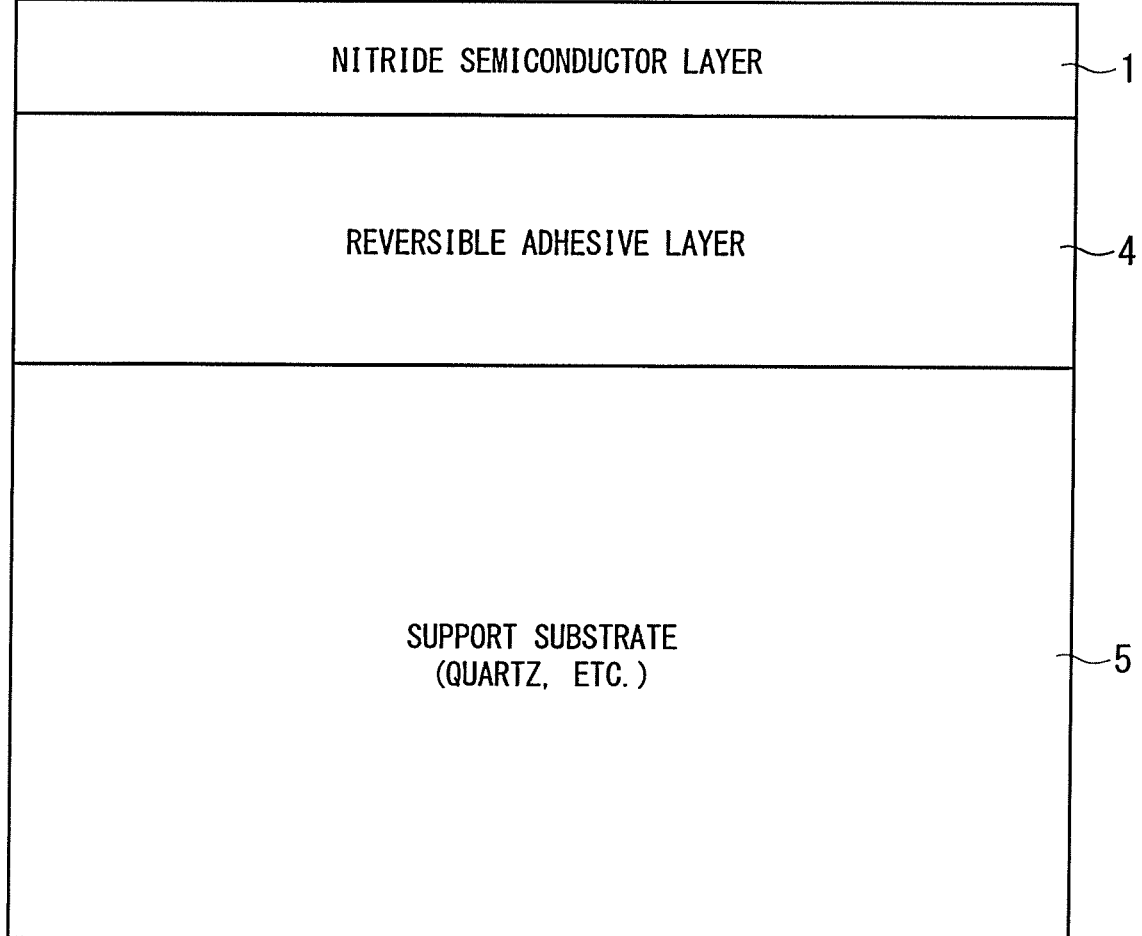

F I G. 6
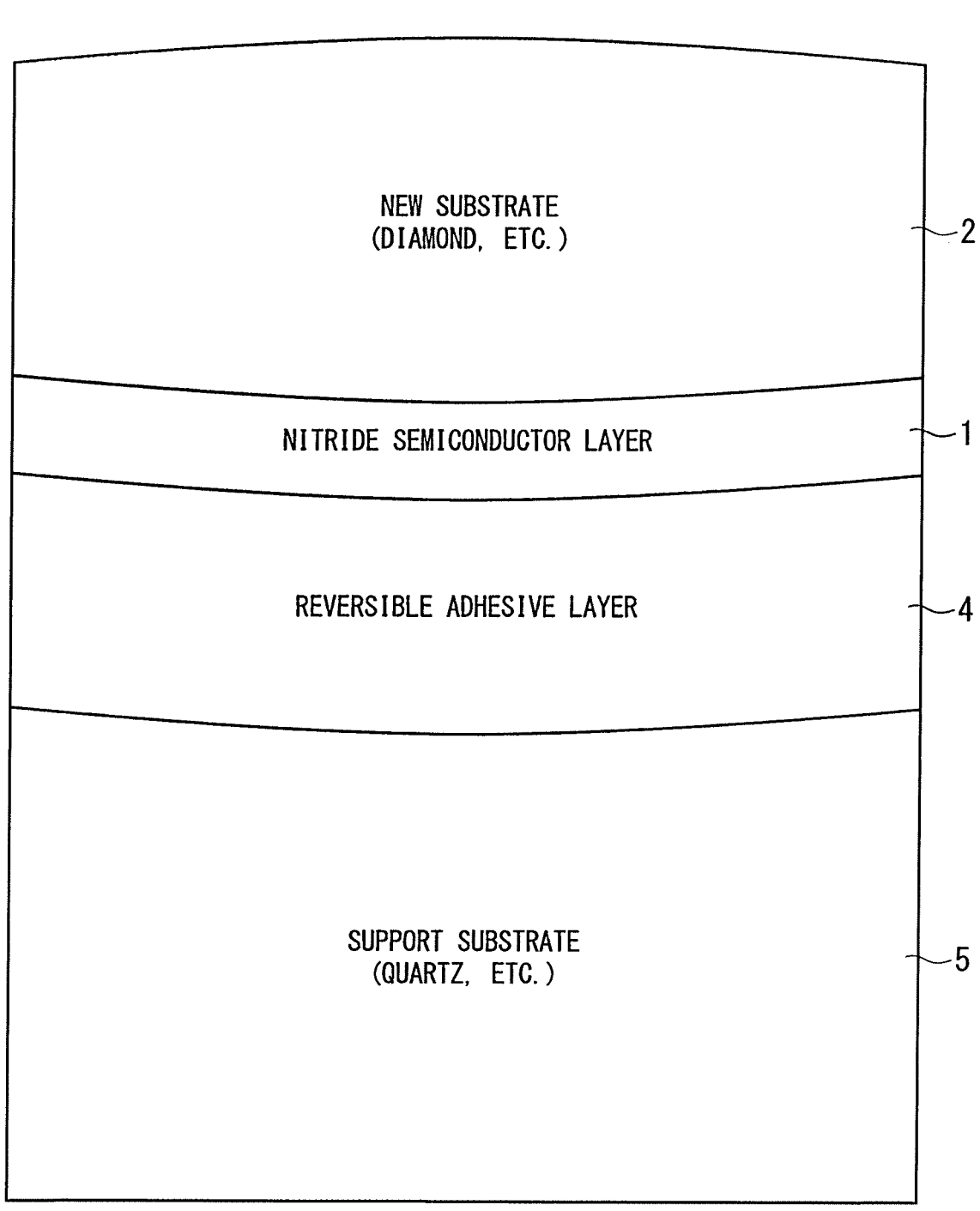

F I G.  7
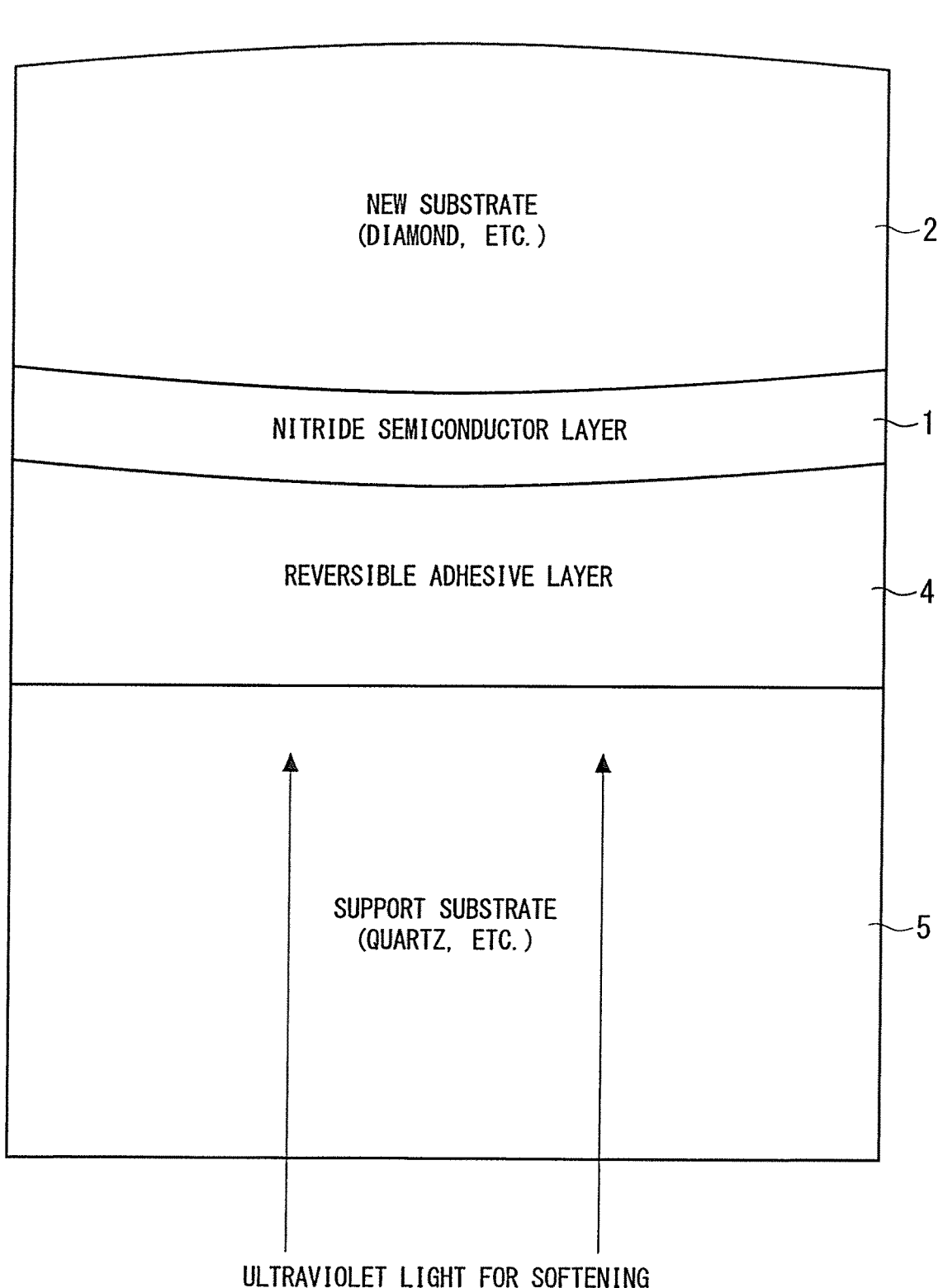
NEW SUBSTRATE
(DIAMOND, ETC.)                    2
NITRIDE SEMICONDUCTOR LAYER        1
REVERSIBLE ADHESIVE LAYER          4
SUPPORT SUBSTRATE
(QUARTZ, ETC.)                     5
ULTRAVIOLET LIGHT FOR SOFTENING
REVERSIBLE ADHESIVE LAYER F I G. 9
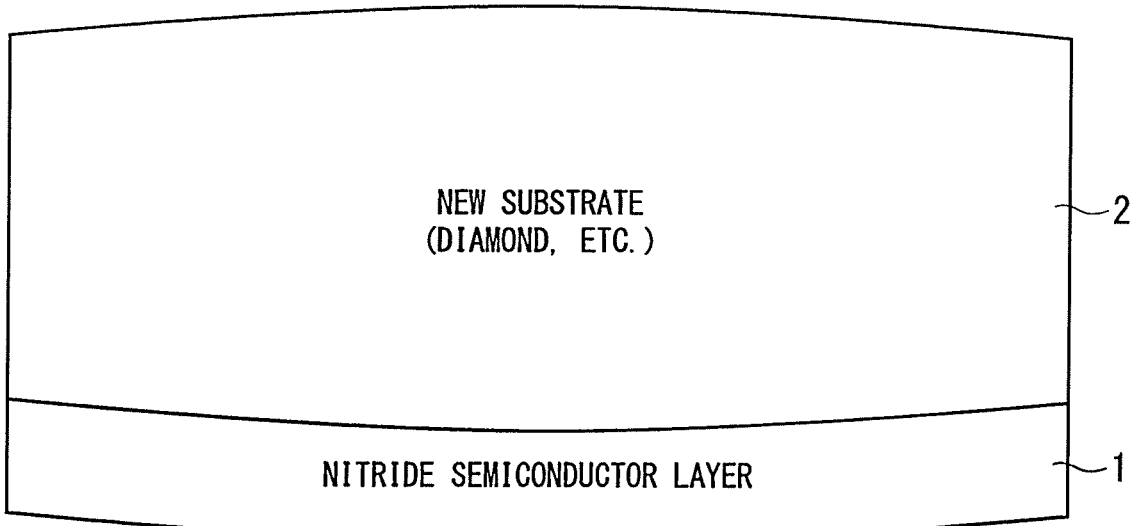

METHOD OF MANUFACTURING SEMICONDUCTOR SUBSTRATE AND METHOD OF MANUFACTURING SEMICONDUCTOR DEVICE

CROSS-REFERENCE TO RELATED APPLICATION

The present application is based on PCT filing PCT/JP2021/004035, filed Feb. 4, 2021, the entire contents of which are incorporated herein by reference.

TECHNICAL FIELD

The present disclosure relates to a method of manufacturing a semiconductor substrate and a method of manufacturing a semiconductor device, and particularly to a method of manufacturing a semiconductor substrate including a nitride semiconductor layer and a semiconductor device made up of a nitride semiconductor.

BACKGROUND ART

Known as a semiconductor element operating in a high output region is a field effect transistor (for example, a high electron mobility transistor (HEMT)) using a nitride semiconductor. When such a semiconductor element operates at high output power, characteristics and reliability may be significantly reduced in some cases when a temperature increases. Thus, a heat radiation material having a high heat radiation property needs to be provided near a heat generation part of the semiconductor element to suppress increase in a temperature of the semiconductor element. Particularly, diamond is a material having a maximum thermal conductivity in solid materials, and has a preferable property as a heat radiation material. Non-Patent Document 1 described hereinafter discloses a technique of using a substrate having a structure that a nitride semiconductor layer including the semiconductor element is formed on diamond, thereby increasing a heat radiation property of a semiconductor element.

In the meanwhile, established as a technique of manufacturing a nitride semiconductor layer is a technique of forming a nitride semiconductor layer by a hetero epitaxial technique on a substrate made of silicon (Si), silicon carbide (SiC), or sapphire (AL$_2$O$_3$), for example, and this technique is widely applied as a part of the technique of manufacturing the nitride semiconductor element. However, the technique of directly forming a nitride semiconductor layer on a diamond substrate by the hetero epitaxial technique is under study, and is not yet established. For example, Non-Patent Document 2 described hereinafter proposes a system of attaching a semiconductor layer and a diamond substrate to integrate them as an example of a technique for forming the semiconductor layer on the diamond substrate.

Generally, a semiconductor layer formed on a growth substrate of epitaxial growth has an extremely small film thickness of approximately several microns, thus it is extremely difficult to separate the semiconductor layer from the growth substrate and attach the semiconductor layer to the other substrate. Thus, in Non-Patent Document 2, the growth substrate is removed after the nitride semiconductor layer formed on the growth substrate is attached to a support substrate (a substrate for temporarily holding the nitride semiconductor layer) to transfer the nitride semiconductor layer to the support substrate. Then, the diamond substrate is attached to an upper surface (surface from which the growth substrate is removed) of the nitride semiconductor layer to transfer the nitride semiconductor layer to the diamond substrate.

As a specific example of a method of temporarily transferring a thin film-like semiconductor layer to a support substrate and then transferring the semiconductor layer to a different type of substrate, disclosed in Patent Document 1, for example, is a method of bonding a support substrate to a semiconductor layer via an adhesive layer made up of resin, performing processing of reducing a thickness of an original substrate, and bonding a different type of substrate and removing the support substrate. In this method, even after forming a three-dimensional structure such as an element structure or a wiring pattern on the semiconductor layer, the three-dimensional structure can be transferred to the other substrate as it is by bonding the semiconductor layer and the support substrate while the three-dimensional structure is embedded into the adhesive layer. Thus, when this method is used, the semiconductor layer can be attached to the different type of substrate by the same process regardless of a shape and structure of the semiconductor element formed on the semiconductor layer.

PRIOR ART DOCUMENTS

Patent Document(s)

Patent Document 1: Japanese Patent Application Laid-Open No. 6-268183 NON-PATENT DOCUMENT(S)
Non-Patent Document 1: Felix Ejeckam, "Keeping cool with diamond" COMPOUND SEMICONDUCTOR, Volume 20, Issue 7, pp. 41
Non-Patent Document 2: D. Francis and other, "Formation and characterization of 4-inch GaN-on-diamond substrates", Diamond & Related Materials 19 (2010), pp. 229-233

SUMMARY

Problem to be Solved by the Invention

The technique of Patent Document 1 described above can also be applied to a technique of transferring a nitride semiconductor layer on a different type of substrate such as a diamond substrate. However, diamond is a material which is difficult to manufacture and has low workability, thus the diamond substrate tends to have a lower quality in a warpage amount and evenness of a thickness of a substrate than an Si substrate or an SiC substrate. When a warpage of the diamond substrate is large or a thickness of the diamond substrate is uneven in a process of attaching the diamond substrate to an upper surface of the nitride semiconductor layer transferred on the support substrate, pressure for attaching the diamond substrate is not uniformly applied to a whole surface of the diamond substrate, and it is difficult to uniformly attach whole surfaces of the nitride semiconductor layer and the diamond substrate.

The present disclosure is to solve the above problems, and an object of the present disclosure is to provide a method of manufacturing a semiconductor substrate in which whole surfaces of a nitride semiconductor layer and a diamond substrate can be uniformly bonded to each other.

Means to Solve the Problem

A method of manufacturing a semiconductor substrate according to the present disclosure includes: a step (a) of attaching a nitride semiconductor layer formed on a growth substrate and a support substrate via a reversible adhesive layer made up of a reversible adhesive agent and curing the reversible adhesive layer; a step (b) of removing the growth substrate to expose the nitride semiconductor layer after the step (a); a step (c) of bonding a new substrate to the nitride semiconductor layer after the step (b); and a step (d) of removing the reversible adhesive layer and the support substrate after the step (c), wherein the step (c) includes: a step (c-1) of pressure-contacting the nitride semiconductor layer and the new substrate; a step of (c-2) of softening the reversible adhesive layer; and a step (c-3) of curing the reversible adhesive layer again after the steps (c-1) and (c-2).

Effects of the Invention

According to the present disclosure, even in a case where a diamond substrate having a large warpage or bulge is used, whole surfaces of the nitride semiconductor layer and the diamond substrate can be uniformly bonded to each other.

These and other objects, features, aspects and advantages of the present disclosure will become more apparent from the following detailed description when taken in conjunction with the accompanying drawings.

BRIEF DESCRIPTION OF DRAWINGS

FIG. 1 A schematic cross-sectional view of a semiconductor substrate according to an embodiment 1.

FIG. 2 A process drawing for explaining a method of manufacturing the semiconductor substrate according to the embodiment 1.

FIG. 3 A process drawing for explaining the method of manufacturing the semiconductor substrate according to the embodiment 1.

FIG. 4 A process drawing for explaining the method of manufacturing the semiconductor substrate according to the embodiment 1.

FIG. 6 A process drawing for explaining the method of manufacturing the semiconductor substrate according to the embodiment 1.

FIG. 7 A process drawing for explaining the method of manufacturing the semiconductor substrate according to the embodiment 1.

FIG. 9 A process drawing for explaining the method of manufacturing the semiconductor substrate according to the embodiment 1.

DESCRIPTION OF EMBODIMENT(S)

Figure 5:
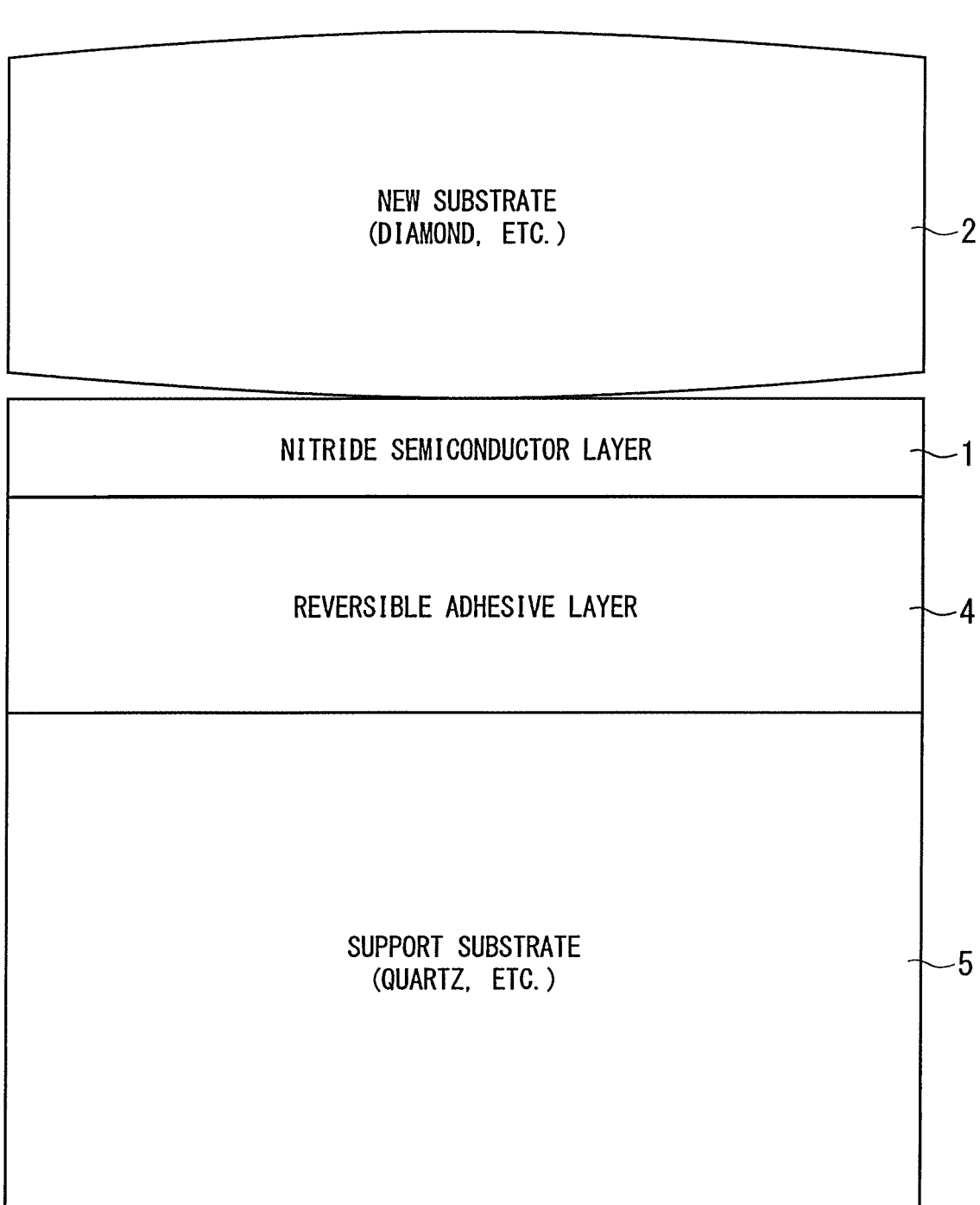
FIG. 5 A process drawing for explaining the method of manufacturing the semiconductor substrate according to the embodiment 1.

Embodiments of a technique according to the present disclosure are described. A technical scope according to the present disclosure is not limited to the embodiments described hereinafter. The drawings described hereinafter are schematically illustrated, thus a shape or a dimension of elements illustrated in the drawings are different from those of actual elements. Elements assigned with the same signs in the plurality of drawings are elements which are the same as each other or correspond to each other.

Embodiment 1

FIG. 1 is a schematic cross-sectional view of a semiconductor substrate 10 according to the present embodiment. As illustrated in FIG. 1, the semiconductor substrate has a structure that a nitride semiconductor layer 1 is formed on a substrate 2 (referred to as "the new substrate 2" hereinafter) different from a substrate used in a hetero epitaxial growth (referred to as "the growth substrate" hereinafter). The nitride semiconductor layer 1 is transferred on the new substrate 2 while a crystal surface in the hetero epitaxial growth is maintained as it is.

FIG. 2 to FIG. 9 are process drawings for explaining a method of manufacturing the semiconductor substrate 10 according to the embodiment 1, and each illustrates a cross section corresponding to FIG. 1. The method of manufacturing the semiconductor substrate according to the embodiment 1 is described with reference to these drawings. The manufacturing method includes a first step to a sixth step described hereinafter.

In the first step, as illustrated in FIG. 2, the nitride semiconductor layer 1 formed on the growth substrate 3 by a hetero epitaxial method and a support substrate 5 as a substrate for temporarily holding the nitride semiconductor layer 1 are attached to each other via a reversible adhesive layer 4 made up of a reversible adhesive agent. The reversible adhesive agent is an adhesive agent in which a cure state and a softened state can be switched by action of light or a temperature. For example, Japanese Patent Application Laid-Open No. 2019-26817 discloses a reversible adhesive agent made up of a liquid crystal polymer compound having a specific molecular structure and reversibly softened and cured by irradiation with light.

After the nitride semiconductor layer 1 and the support substrate 5 are attached to each other, processing of curing the reversible adhesive layer 4 is performed for a purpose of increasing mechanical strength of the reversible adhesive layer 4. A condition of curing the reversible adhesive layer 4 is different depending on a reversible adhesive agent constituting the reversible adhesive layer 4. For example, when the reversible adhesive agent made up of the liquid crystal polymer compound described above is used, the processing of curing the reversible adhesive layer 4 can be performed by irradiating the reversible adhesive layer 4 with visible light having a wavelength ranging from 420 nm to 600 nm. Glass, sapphire, silicon, and SiC, for example, can be used as a material of the support substrate 5, however, when the cure state and the softened state of the reversible adhesive layer 4 is switched by irradiation with light, a material through which light used for curing and softening the reversible adhesive layer 4 passes needs to be used for the material of the support substrate 5.

In the second step, as illustrated in FIG. 3, a portion on a back side of the growth substrate 3 (a side opposite to a surface thereof on which the nitride semiconductor layer 1 is formed) is removed to reduce a thickness of the growth substrate 3 to have a constant thickness. Mechanical grinding, dry etching, and etching by a solution, for example, can be used as a method of removing the growth substrate 3 in the second step, however, it is preferable to use the mechanical grinding from a viewpoint of a removal speed in the second step. The second step is preferably performed so that a thickness of the remaining growth substrate 3 is equal to or larger than 5 μm and smaller than 100 μm, and the thickness of the remaining growth substrate 3 is more preferably equal to or larger than 7 μm and smaller than 30 μm. When the thickness of the remaining growth substrate 3 after the second step is larger than that described above, a time required for the subsequent third step increases, and this increase leads to increase in manufacturing cost of the semiconductor substrate 10. When the thickness of the remaining growth substrate 3 after the second step is smaller than that described above, inner stress of the nitride semiconductor layer 1 is reduced, and there is a high possibility of occurrence of a crack.

In the third step, as illustrated in FIG. 4, the growth substrate 3 whose thickness is reduced in the second step is completely removed to expose the nitride semiconductor layer 1. A mechanical polishing method, a chemical mechanical polishing method, a dry etching method, and etching by a solution, for example, can be used as a method of removing the growth substrate 3 in the third step, however, it is preferable to use the chemical mechanical polishing method in the third step. When the third step is performed by the chemical mechanical polishing method, a surface of the exposed nitride semiconductor layer 1 is accurately flattened in an atomic layer level, thus strength after attaching the nitride semiconductor layer 1 and the new substrate 2 is increased.

In the fourth step, the new substrate 2 is attached to the nitride semiconductor layer 1 exposed in the third step. A substrate having a high thermal conductivity is preferable as the new substrate 2 to improve performance and reliability of the nitride semiconductor element formed on the nitride semiconductor layer 1, and a diamond substrate is particularly preferable. A surface activation bonding method and an atom diffusion bonding method, for example, can be used as a method of attaching the nitride semiconductor layer 1 and the new substrate 2, however, preferable is a method capable of reducing an interfacial thermal resistance between the nitride semiconductor layer 1 and the new substrate 2 as much as possible to improve performance and reliability of the nitride semiconductor element. Thus, the surface activation bonding is particularly preferable. When the surface activation bonding method is used, activation processing is performed on a surface of each of the nitride semiconductor layer 1 and the new substrate 2, and then the nitride semiconductor layer 1 and the new substrate 2 are disposed to face each other and pressure-contacted as illustrated in FIG. 5 in a bonding device. At this time, when a warpage or a bulge of the new substrate 2 is large, the nitride semiconductor layer 1 and the support substrate 5 are deformed along a surface shape of the new substrate 2 as illustrated in FIG. 6.

Figure 8:
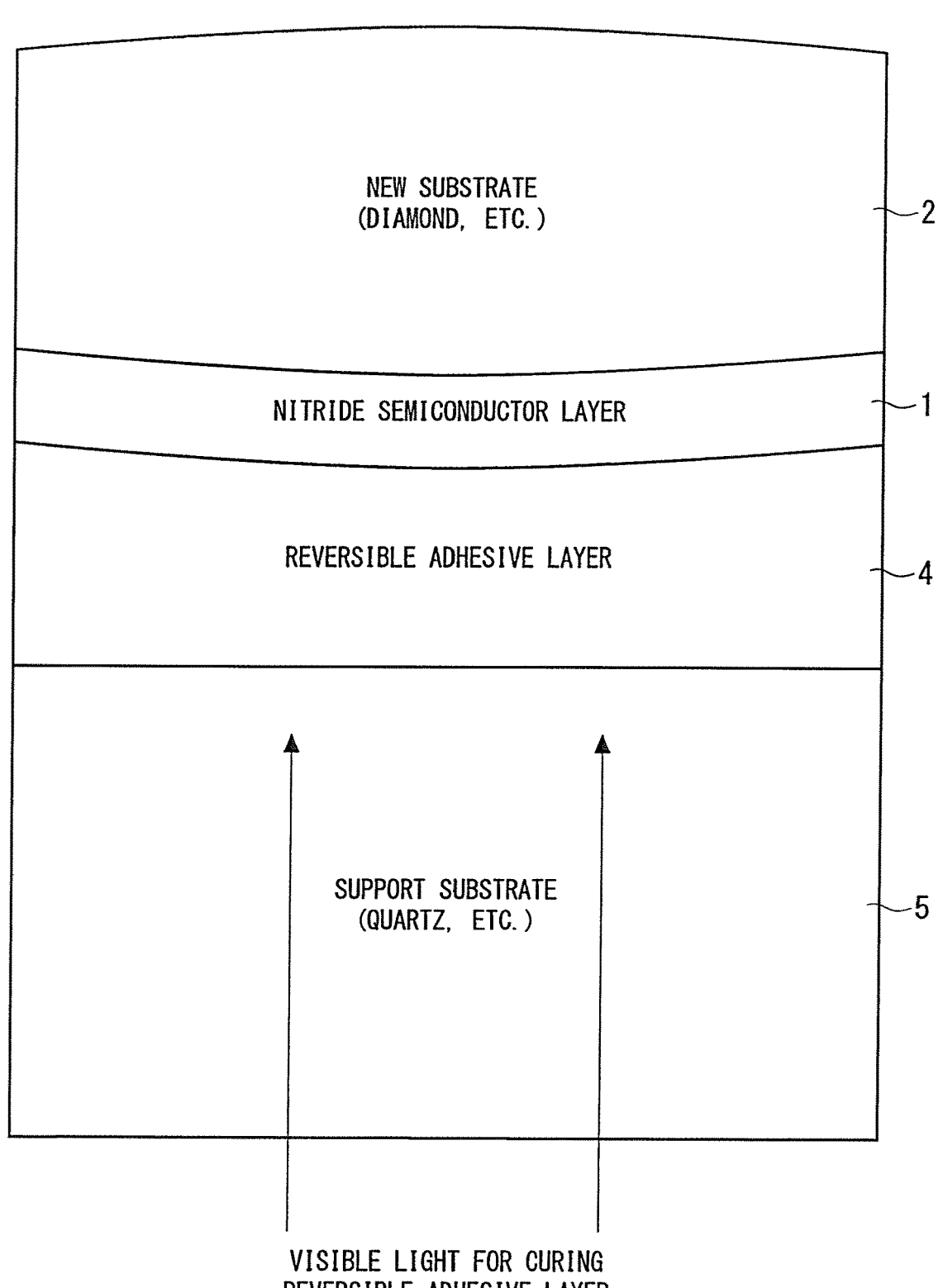
FIG. 8 A process drawing for explaining the method of manufacturing the semiconductor substrate according to the embodiment 1.

In the fifth step, processing for temporarily making the reversible adhesive layer 4 be in a softened state is performed as illustrated in FIG. 7 while the nitride semiconductor layer 1 and the new substrate 2 are pressure-contacted, and then processing of curing the reversible adhesive layer 4 again is performed as illustrated in FIG. 8. When the reversible adhesive agent made up of the liquid crystal polymer compound described above is used, the processing of softening the reversible adhesive layer 4 can be performed by irradiating the reversible adhesive layer 4 with ultraviolet light having a wavelength ranging from 300 nm to 400 nm via the support substrate 5, and the processing of curing the reversible adhesive layer 4 can be performed by irradiating the reversible adhesive layer 4 with visible light having a wavelength ranging from 420 nm to 600 nm via the support substrate 5. After the processing of curing the reversible adhesive layer 4 is performed, pressure for forming bonding between the nitride semiconductor layer 1 and the new substrate 2 is released, and a sample (a structure illustrated in FIG. 8) is taken out from the bonding device.

In the sixth step, as illustrated in FIG. 9, the reversible adhesive layer 4 and the support substrate 5 are removed. As a result, the semiconductor substrate 10 illustrated in FIG. 1 is completed. The sixth step can be performed by pulling off the support substrate 5 from the nitride semiconductor layer 1 by a physical method after making the reversible adhesive layer 4 be in the softened state by irradiation with ultraviolet light via the support substrate 5, and subsequently immersing the nitride semiconductor layer 1 in an organic solvent, thereby removing the reversible adhesive layer 4 from the surface of the nitride semiconductor layer 1.

Herein, an effect obtained in the present embodiment is described. For example, when an adhesive layer with no reversibility is used in place of the reversible adhesive layer 4, the fifth step cannot be performed. In this case, when the pressure for forming bonding between the nitride semiconductor layer 1 and the new substrate 2 is released, force of restoring the support substrate 5 which has been deformed in the fourth step to have an original shape is applied. This force acts to detach the nitride semiconductor layer 1 from the new substrate 2, thus bonding cannot be formed in a region where this force exceeds bonding force between the nitride semiconductor layer 1 and the new substrate 2. For example, when the new substrate 2 has a shape in which a center portion is thicker than a peripheral edge portion (when a cross-sectional shape of the new substrate 2 is a convex lens-like shape), the force of restoring the support substrate 5 to have the original shape acts to detach the nitride semiconductor layer 1 from the new substrate 2 in the peripheral edge portion of the new substrate 2.

In contrast, in the present embodiment, the reversible adhesive layer 4 is temporarily made to be in the softened state in the fifth step, thus inner stress of the reversible adhesive layer 4 is released while the nitride semiconductor layer 1 and the new substrate 2 are firmly attached to each other. Then, the deformation of the support substrate 5 occurring in the fourth step is resolved, and the support substrate 5 is restored to have the original shape. Accordingly, even when the pressure for forming bonding between the nitride semiconductor layer 1 and the new substrate 2 is released, the force of restoring the support substrate 5 to have the original shape is not applied, but bonding between the nitride semiconductor layer 1 and the new substrate 2 is maintained. Thus, even when a warpage or a bulge of the new substrate 2 is large, the whole surfaces of the nitride semiconductor layer 1 and the new substrate 2 can be uniformly bonded.

In the present embodiment, after the nitride semiconductor layer 1 and the new substrate 2 are pressure-contacted in the bonding device in the fourth step, the processing of temporarily making the reversible adhesive layer 4 be in the softened state is performed in the fifth step, however, an order of performing them may be reversed. That is to say, it is also applicable that the reversible adhesive layer 4 is previously made to be in the softened state, and the nitride semiconductor layer 1 and the new substrate 2 are pressure-contacted in the bonding device in that state.

The semiconductor substrate 10 manufactured by the manufacturing method according to the present embodiment can maintain a state where the whole surfaces of the nitride semiconductor layer 1 and the new substrate 2 are uniformly bonded even when the diamond substrate having the large warpage is used as the new substrate 2. Accordingly, a yield in the step of forming the nitride semiconductor element on the nitride semiconductor layer 1 can be improved. When the new substrate 2 functions as the heat radiation substrate, a heat radiation property of the nitride semiconductor element formed on the nitride semiconductor layer 1 can be increased, thus such a function can contribute to improvement of reliability of the nitride semiconductor element.

Embodiment 2

In the method of manufacturing the semiconductor substrate 10 described in the embodiment 1, the semiconductor substrate 10 is formed using the nitride semiconductor layer 1 in which the semiconductor elements such as an HEMT is not formed, however, in an embodiment 2, the semiconductor substrate 10 is formed using the nitride semiconductor layer 1 in which the semiconductor element is formed in advance. That is to say, the semiconductor element mounted to the semiconductor device is already incorporated into the semiconductor substrate 10 manufactured by the method of manufacturing the semiconductor substrate 10 according to the embodiment 2.

Accordingly, the method of manufacturing the semiconductor substrate 10 according to the embodiment 2 constitutes a part of the method of manufacturing the semiconductor device. The method of manufacturing the semiconductor substrate 10 according to the embodiment 2 is similar to that according to the embodiment 1 except that the semiconductor element is formed in advance in the nitride semiconductor layer 1 used in the first step. FIG. 2 to FIG. 9 described in the embodiment 1 are referenced also in the description of the method of manufacturing the semiconductor substrate 10 according to the embodiment 2 described hereinafter. The description overlapped with that of the embodiment 1 is appropriately omitted.

Performed in the embodiment 2 is a step of forming the semiconductor element (nitride semiconductor element) on the nitride semiconductor layer 1 on the growth substrate 3 prior to the first step. An optional element may be applied to the semiconductor element formed in the nitride semiconductor layer 1, and an HEMT is formed in the present embodiment. An optional method may be applied to the method of forming the nitride semiconductor element, and applicable is a method disclosed in "AlGaN/GaN Heterojunction FETs for High Power Applications", IEICE Transactions on Electronics (Japanese Edition), Vol. J86-C, No. 4, pp. 396 to 403, April 2003, for example.

In the first step, as illustrated in FIG. 2, the nitride semiconductor layer 1 in which the semiconductor element is formed and the support substrate 5 are attached to each other via the reversible adhesive layer 4 made up of the reversible adhesive agent of the liquid crystal polymer compound, for example. The, the processing of curing the reversible adhesive layer 4 is performed for a purpose of increasing mechanical strength of the reversible adhesive layer 4.

In the second step, as illustrated in FIG. 3, the portion on the back side of the growth substrate 3 (the side opposite to the surface thereof on which the nitride semiconductor layer 1 is formed) is removed by mechanical griding, for example, to reduce the thickness of the growth substrate 3 to have the constant thickness.

In the third step, as illustrated in FIG. 4, the growth substrate 3 whose thickness is reduced in the second step is completely removed by a chemical mechanical polishing method, for example, to expose the nitride semiconductor layer 1.

In the fourth step, the new substrate 2 made of diamond, for example, is attached to the nitride semiconductor layer 1 exposed in the third step. When the surface activation bonding method is used, activation processing is performed on the surface of each of the nitride semiconductor layer 1 and the new substrate 2, and then the nitride semiconductor layer 1 and the new substrate 2 are disposed to face each other and pressure-contacted as illustrated in FIG. 5 in the bonding device. At this time, when the warpage or the bulge of the new substrate 2 is large, the nitride semiconductor layer 1 and the support substrate 5 are deformed along the surface shape of the new substrate 2 as illustrated in FIG. 6.

In the fifth step, the processing for temporarily making the reversible adhesive layer 4 be in a softened state is performed as illustrated in FIG. 7 while the nitride semiconductor layer 1 and the new substrate 2 are pressure-contacted, and then the processing of curing the reversible adhesive layer 4 again is performed as illustrated in FIG. 8. Then, the pressure for forming bonding between the nitride semiconductor layer 1 and the new substrate 2 is released, and the sample (the structure illustrated in FIG. 8) is taken out from the bonding device.

In the sixth step, as illustrated in FIG. 9, the reversible adhesive layer 4 and the support substrate 5 are removed. As a result, the semiconductor substrate 10 illustrated in FIG. 1 is completed.

Also in the present embodiment, after the nitride semiconductor layer 1 and the new substrate 2 are pressure-contacted in the bonding device in the fourth step, the processing of temporarily making the reversible adhesive layer 4 be in the softened state is performed in the fifth step, however, the order of performing them may be reversed. That is to say, it is also applicable that the reversible adhesive layer 4 is previously made to be in the softened state, and the nitride semiconductor layer 1 and the new substrate 2 are pressure-contacted in the bonding device in that state.

The semiconductor substrate 10 manufactured by the manufacturing method according to the present embodiment can maintain the state where the whole surfaces of the nitride semiconductor layer 1 and the new substrate 2 are uniformly bonded even when the diamond substrate having the large warpage is used as the new substrate 2. Accordingly, the yield in the step of forming the nitride semiconductor element on the nitride semiconductor layer 1 can be improved. When the new substrate 2 functions as the heat radiation substrate, the heat radiation property of the nitride semiconductor element formed on the nitride semiconductor layer 1 can be increased, thus such a function can contribute to improvement of the reliability of the nitride semiconductor element.

Each embodiment can be arbitrarily combined, or each embodiment can be appropriately varied or omitted.

The foregoing description is in all aspects illustrative, and is therefore understood that numerous modification examples not illustrated can be devised.

EXPLANATION OF REFERENCE SIGNS

10 semiconductor substrate, 1 nitride semiconductor layer, 2 new substrate, 3 growth substrate, 4 reversible adhesive layer, 5 support substrate.

The invention claimed is:

1. A method of manufacturing a semiconductor substrate, comprising:

(a) attaching a semiconductor layer formed on a growth substrate and a support substrate via a reversible adhesive layer made up of a reversible adhesive agent and curing the reversible adhesive layer;

(b) removing the growth substrate to expose the semiconductor layer after the step (a);

(c) bonding a new substrate to the semiconductor layer after the step (b); and (d) removing the reversible adhesive layer and the support substrate after the step (c), wherein the step (c) includes:

(c-1) pressure-contacting the semiconductor layer and the new substrate;

(c-2) softening the reversible adhesive layer; and (c-3) curing the reversible adhesive layer again after the steps (c-1) and (c-2).

2. The method of manufacturing the semiconductor substrate according to claim 1, wherein the reversible adhesive agent is an adhesive agent in which a cure state and a softened state are switched by a wavelength of light with which the reversible adhesive agent is irradiated.

3. The method of manufacturing the semiconductor substrate according to claim 1, wherein the step (c-2) is performed after the step (c-1).

4. The method of manufacturing the semiconductor substrate according to claim 2, wherein the step (c-2) is performed after the step (c-1).

5. The method of manufacturing the semiconductor substrate according to claim 1, wherein the step (c-1) is performed after the step (c-2).

6. The method of manufacturing the semiconductor substrate according to claim 2, wherein the step (c-1) is performed after the step (c-2).

7. A method of manufacturing a semiconductor device, comprising:

performing the method of manufacturing the semiconductor substrate according to claim 1, and further comprising (e) forming a semiconductor element in the semiconductor layer prior to the step (a).

8. A method of manufacturing a semiconductor device, comprising:

performing the method of manufacturing the semiconductor substrate according to claim 2, and further comprising (e) forming a semiconductor element in the semiconductor layer prior to the step (a).

9. A method of manufacturing a semiconductor device, comprising:

performing the method of manufacturing the semiconductor substrate according to claim 3, and further comprising (e) forming a semiconductor element in the semiconductor layer prior to the step (a).

10. A method of manufacturing a semiconductor device, comprising:

performing the method of manufacturing the semiconductor substrate according to claim 4, and further comprising (e) forming a semiconductor element in the semiconductor layer prior to the step (a).

11. A method of manufacturing a semiconductor device, comprising:

performing the method of manufacturing the semiconductor substrate according to claim 5, and further comprising (e) forming a semiconductor element in the semiconductor layer prior to the step (a).

12. A method of manufacturing a semiconductor device, comprising:

performing the method of manufacturing the semiconductor substrate according to claim 6, and further comprising (e) forming a semiconductor element in the semiconductor layer prior to the step (a).

* * * * *